(12) United States Patent
Matsushima et al.

(10) Patent No.: US 7,480,495 B2
(45) Date of Patent: Jan. 20, 2009

(54) CATV TUNER AND ONE-CHIP IC USED THEREIN

(75) Inventors: Akimasa Matsushima, Omihachiman (JP); Yoji Maeda, Shiga-ken (JP); Hiroyuki Tetsuno, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1429 days.

(21) Appl. No.: 10/379,722

(22) Filed: Mar. 6, 2003

(65) Prior Publication Data

US 2003/0177505 A1 Sep. 18, 2003

(30) Foreign Application Priority Data

Mar. 18, 2002 (JP) ............... 2002-074426

(51) Int. Cl.
G06F 3/033 (2006.01)

(52) U.S. Cl. ............... 455/130; 455/180.2; 455/180.3; 455/188.2; 455/209; 455/255; 725/100; 725/151

(58) Field of Classification Search ............... 455/130, 455/180.2, 180.3, 188.2, 209, 255, 260, 454; 725/100, 151
See application file for complete search history.

(56) References Cited

U.S. PATENT DOCUMENTS 4,726,072 A * 2/1988 Yamashita et al. ....... 455/189.1
5,014,349 A * 5/1991 Kubo et al. ............... 455/189.1
5,193,005 A * 3/1993 Tomita ....................... 348/731
5,203,032 A * 4/1993 Usui ......................... 455/182.2
5,574,997 A * 11/1996 Hong ....................... 455/180.1
6,131,023 A 10/2000 Matsuura
6,522,872 B1 * 2/2003 Nishimura et al. .......... 455/301

FOREIGN PATENT DOCUMENTS

| CN | 1220547 A | 6/1999 |
| JP | 61-64731 | 5/1986 |
| JP | 11-127086 | 5/1999 |
| JP | 11-127211 | 5/1999 |
| JP | 11-163755 | 6/1999 |
| WO | WO 0062532 A1 | 10/2000 |

* cited by examiner

*Primary Examiner*—Sanh D Phu
(74) *Attorney, Agent, or Firm*—Keating & Bennett, LLP

(57) ABSTRACT

A CATV tuner includes a metallic housing having first through fourth partitioned chambers. In the first through fourth partitioned chambers, a data circuit, an input filter circuit, a first mixer circuit, a first local oscillation circuit, a first intermediate frequency circuit, and other elements are housed. In the fifth partitioned chamber, a second intermediate circuit and an IC including a second local oscillation circuit are housed. With this configuration, the CATV tuner defines an up/down tuner. The third partitioned chamber in which the first local oscillation circuit is housed and the fifth partitioned chamber in which the second local oscillation circuit is housed are located adjacent to each other. Lines and terminals are used both for a first PLL circuit and a second PLL circuit.

17 Claims, 6 Drawing Sheets

CATV TUNER AND ONE-CHIP IC USED THEREIN

BACKGROUND OF THE INVENTION

1. Field of the Invention

The present invention relates to cable television (CATV) tuners and one-chip integrated circuits (IC) used therein. More particularly, the present invention relates to an up/down tuner for converting a received signal into a first intermediate frequency, which is a higher frequency signal, and for further converting the first intermediate frequency into a second intermediate frequency, which is a lower frequency signal. The present invention also pertains to a one-chip IC used in this type of up/down tuner.

2. Description of the Related Art

FIG. 4 is a schematic view illustrating an example of a known CATV tuner. A CATV tuner 1 includes a metallic housing 2. The housing 2 is divided into six partitioned chambers 2A, 2B, 2C, 2D, 2E, and 2F.

In the partitioned chamber 2A, a data circuit 10 is housed therein. The data circuit 10 includes, as shown in FIG. 5, a first low-pass filter 12 and a branch circuit 14 to which an input portion IN is connected. A cable from a CATV station is connected to the input portion IN, and a received RF signal is branched at the branch circuit 14. One branched signal is supplied to a subsequent circuit, and the other branched signal is supplied to a terminal DOWN and is output from the CATV tuner 1. The first low-pass filter 12 is connected to an upstream terminal UP. In interactive broadcasting, a signal to be output to the CATV station is output to the cable connected to the input terminal IN via the first low-pass filter 12.

In the partitioned chamber 2B, an input filter circuit 16 is housed therein, as shown in FIG. 4. The input filter circuit 16 includes, as shown in FIG. 5, a first band-pass filter 18 and an attenuator circuit 20. The RF signal passing through the data circuit 10 is filtered in the first band-pass filter 18 and is attenuated in the attenuator circuit 20. A control signal is input into the attenuator circuit 20 from an external gain control circuit via a terminal AGC. The RF signal is attenuated so that the gain is adjusted by this control signal. Because of the attenuation of the RF signal, the intensity of the RF signal input into a first amplifier 22 is suitably adjusted, and distortion of the signal generated in the CATV tuner 1 is reduced.

In the partitioned chamber 2C, the first amplifier 22 and a first mixer circuit 24 are housed therein. The signal attenuated in the attenuator circuit 20 is amplified in the first amplifier 22, and is mixed with a first local oscillation signal in the first mixer circuit 24, resulting in a first intermediate frequency signal, which is a higher frequency signal than the RF signal.

In the partitioned chamber 2C, a first local oscillation circuit 26 for supplying the first local oscillation signal to the first mixer circuit 24 is also housed therein. The first local oscillation circuit 26 includes a first phase-locked loop circuit (hereinafter referred to as the "PLL circuit") 28 and a first voltage-controlled oscillator 30. A quartz oscillator 32 for supplying a reference frequency signal is connected to the first PLL circuit 28. The frequency of the signal output from the first PLL circuit 28 is adjusted by a channel-selection data signal supplied from a terminal SDA and a clock signal supplied from a terminal SCL. The signal output from the first PLL circuit 28 controls the frequency of the voltage-controlled oscillator 30, resulting in the first local oscillation signal being produced. This first local oscillation signal is supplied to the first mixer circuit 24, and the first intermediate frequency signal, which is a higher frequency signal than the RF signal, is output from the first mixer circuit 24.

In the partitioned chamber 2D, a first intermediate frequency circuit 34 is housed therein. The first intermediate frequency circuit 34 includes a second band-pass filter 36, a second amplifier 38, and a third band-pass filter 40. In the first intermediate frequency circuit 34, the first intermediate frequency signal is filtered and amplified.

In the partitioned chamber 2E, a second mixer circuit 42 and a second intermediate frequency circuit 44 are housed therein. The second intermediate frequency circuit 44 includes a second low-pass filter 46, a third amplifier 48, a fourth band-pass filter 50, and a fourth amplifier 52. In the second mixer circuit 42, a signal output from the third band-pass filter 40 is mixed with a second local oscillation signal, and a resulting second intermediate frequency signal is supplied to the second intermediate frequency circuit 44.

In the partitioned chamber 2F, a second local oscillation circuit 54 for supplying the second local oscillation signal is housed therein. The second local oscillation circuit 54 includes a second PLL circuit 56 and a second voltage-controlled oscillator 58. A reference frequency signal is distributed from the first PLL circuit 28, and is supplied to the second PLL circuit 56 via a distribution line 60. Noise is easily mixed into the reference frequency signal, which is transmitted from the first PLL circuit 28 to the second PLL circuit 56, and thus, a noise-eliminating filter 62 is attached to the distribution line 60.

The frequency of the signal output from the second PLL circuit 56 is adjusted by a data signal supplied via a terminal SDA, which is not connected to the first PLL circuit 28, and a clock signal supplied via a terminal SCL. A signal from the second PLL circuit 56 controls the frequency of the second voltage-controlled oscillator 58, resulting in the second local oscillation signal being produced. The second local oscillation signal is supplied to the second mixer circuit 42, and the second mixer circuit 42 outputs the second intermediate frequency signal, which is a lower frequency signal than the RF signal. The second intermediate frequency signal is filtered and amplified in the second intermediate frequency circuit 44, and is supplied to an output terminal OUT.

As shown in FIG. 6, the housing 2 includes a partitioned frame 3, and metallic covers 4a and 4b, which respectively cover the top and the bottom surfaces of the frame 3. For improving the shielding characteristic, metallic plates 5a and 5b are inserted between the frame 3 and the cover 4a and between the frame 3 and the cover 4b, respectively. For connecting the CATV tuner 1 to an external circuit, as shown in FIG. 4, a plurality of terminals 6 including the terminals SDA and the terminals SCL are arranged such that they project from the housing 2 to the exterior. A feedthrough capacitor is soldered to the frame 3 such that the terminals 6 pass through the feedthrough capacitor, thereby preventing interference between signal components, which may leak from the first local oscillation circuit 26 and the second oscillation circuit 54 via the terminals 6.

In the CATV tuner 1, since a received RF signal has a very wide frequency range, for example, from 55 MHz to 860 MHz, it is first mixed with the first local oscillation signal (for example, having a frequency of 1.28 GHz to 2.1 GHz) output from the first local oscillation circuit 26, and is converted into the first intermediate frequency signal (for example, having a central frequency of 1.23 GHz and a bandwidth of 6 MHz), which is a higher frequency signal than the RF signal. Simultaneously, the channel is selected by the data signal supplied to the first PLL circuit 28.

In the second mixer circuit 42, the first intermediate frequency signal is mixed with the second local oscillation signal (fixed at, for example, 1.185 GHz) output from the second local oscillation circuit 54, and is converted into the second intermediate frequency signal (having a central frequency of 44 MHz and a bandwidth of 6 MHz), which is a lower frequency signal than the RF signal. In this manner, the RF signal is converted into the first intermediate frequency signal, which is higher than the RF signal, and is then converted into the second intermediate frequency signal, which is lower than the RF signal. Accordingly, such a CATV tuner is referred to as an "up/down tuner".

In such a CATV tuner, a single balanced mixer (SBM) or a double balanced mixer (DBM) is used as the first mixer circuit 24 so as to suppress distortion even if the RF signal contains adjacent channels. Local oscillation signals having a power that is a few hundred times as high as the RF signal are input to the first and second mixer circuits 24 and 42. Accordingly, fundamental waves and higher harmonics, which may leak from the first local oscillation circuit 26 and from the second local oscillation circuit 54 to the first and second mixer circuits and 24 and 42, may cause the generation of a signal (interfering waves) indicating the sum or the difference of the signal components of the first and second local oscillation circuits 26 and 54.

In order to avoid the generation of interfering waves, interference between signals output from the first local oscillation circuit 26 and the second local oscillation circuit 54 must be prevented. For this purpose, in the CATV tuner 1, the circuit blocks, such as the first local oscillation circuit 26 and the second local oscillation circuit 54, are located in the partitioned chambers exhibiting a shielding characteristic. It should be noted that partitioned chambers, which are used in a CATV tuner, are not necessarily used in a simple down-tuner, such as a terrestrial receiving tuner.

Even in a CATV tuner in which circuit blocks are located in partitioned chambers, it is difficult to sufficiently prevent interference between first and second local oscillation circuits if they are located adjacent to each other. Accordingly, in the CATV tuner 1, the first local oscillation circuit 26 and the second local oscillation circuit 54 are separated to be as far apart as possible, and the other partitioned chambers are located therebetween. Also, the metallic plates 5a and 5b are inserted between the partitioned frame 3 and the covers 4a and 4b, as discussed above, thereby preventing interference, which would otherwise be generated between the first and second local oscillation circuits 26 and 54.

In a known CATV tuner, however, since a first PLL circuit and a second PLL circuit are separated from each other, noise is easily mixed into a distribution line for distributing a reference frequency signal of the first PLL circuit to the second PLL circuit, and a noise eliminating filter has to be attached to the distribution line. Additionally, terminals for supplying a clock signal and a data signal must be provided for each of the first PLL circuit and the second PLL circuit. This increases the number of terminals, thereby making the resulting CATV tuner larger.

A feedthrough capacitor is attached to a frame so as to prevent leakage of signal components from the first local oscillation circuit and the second local oscillation circuit via terminals. However, this increases the cost for additional parts, and also, the fixing operation is required, thereby increasing the overall cost of the CATV tuner. Additionally, metallic plates, which are inserted between the partitioned chambers and the cover, also increase the overall cost.

SUMMARY OF THE INVENTION

In order to overcome the problems described above, preferred embodiments of the present invention provide an inexpensive and small CATV tuner which is able to prevent the generation of interfering waves caused by interference between signal components between a first local oscillation circuit and a second local oscillation circuit. In addition, other preferred embodiments of the present invention provide a one-chip IC suitable for use in the above-described CATV tuner.

According to a preferred embodiment of the present invention, a cable television tuner, which functions as an up/down tuner, includes a data circuit for transmitting and receiving a signal to and from a cable television station, an input filter circuit for filtering the signal received by the data circuit, a first mixer circuit for mixing the signal passing through the input filter circuit with a first local oscillation signal to generate a first intermediate frequency signal, a first local oscillation circuit including a first phase-locked loop circuit and a first voltage-controlled oscillator used for supplying the first local oscillation signal to the first mixer circuit, a first intermediate frequency circuit for filtering and amplifying the first intermediate frequency signal, a second mixer circuit for mixing a signal output from the first intermediate frequency circuit with a second local oscillation signal to generate a second intermediate frequency signal, a second local oscillation circuit including a second phase-locked loop circuit and a second voltage-controlled oscillator used for supplying the second local oscillation signal to the second mixer circuit, a second intermediate frequency circuit for filtering and amplifying the second intermediate frequency signal, and a metallic housing including a plurality of partitioned chambers for housing therein the data circuit, the input filter circuit, the first mixer circuit, the first local oscillation circuit, the first intermediate frequency circuit, the second mixer circuit, the second local oscillation circuit, and the second intermediate frequency circuit. The second mixer circuit is preferably a double balanced mixer, and the second mixer circuit, the second phase-locked loop circuit, and the second voltage-controlled oscillator are integrated into a one-chip integrated circuit. The first local oscillation circuit and the second local oscillation circuit are housed in the partitioned chambers that are adjacent to each other.

In the cable television tuner described in the preceding paragraph, a common clock terminal may be used for the first phase-locked loop circuit and the second phase-locked loop circuit, and a common data terminal may be used for the first phase-locked loop circuit and the second phase-locked loop circuit.

The housing may include a metallic frame and covers for covering the top and bottom surfaces of the metallic frame, each of the covers being defined by a single metallic plate.

A terminal without a feedthrough capacitor, which is used for connecting the cable television tuner to an external circuit, may be arranged so that it projects from the housing to the exterior.

In this CATV tuner, the second mixer, the second PLL circuit, and the second voltage-controlled oscillator are preferably integrated into a one-chip IC. Accordingly, the signal paths among these circuits are restricted within the IC, thereby preventing leakage of the signals from the circuits. By integrating these circuits into a one-chip IC, the output level does not have to be as high as that when the circuits are individually disposed, thereby optimizing the output level of the second local oscillation circuit 54. As a result, leakage of the signals outside the IC is reliably prevented.

Additionally, since a double balanced mixer (DBM) is preferably used as the second mixer circuit, the frequency of the second local oscillation circuit is not output from the mixer circuit because of the configuration of the circuit. Also as a result of this feature, leakage of the signals is minimized.

As discussed above, leakage of the signals from the first and second local oscillation circuits is prevented. Accordingly, the first local oscillation circuit and the second local oscillation circuit can be located adjacent to each other. This makes it possible to shorten the lines for supplying the clock signal and the data signal to the PLL circuits of the first and second local oscillation circuits. Accordingly, the terminals for supplying the clock signal and the data signal can be used both for the two PLL circuits.

Additionally, since the two PLL circuits are located adjacent to each other, a distribution line for the reference frequency signal can be made shorter. Thus, noise can be prevented from being mixed into the distribution line, thereby eliminating the need to attach a noise-eliminating filter to the distribution line.

Since there is also less leakage of the signals from the local oscillation circuits, the need to attach a feedthrough capacitor to the terminals and to insert metallic plates between the partitioned chambers and the covers can be eliminated.

With the above-described configuration, the size of the CATV tuner of preferred embodiments of the present invention can be greatly reduced. Additionally, the number of parts and the number of manufacturing steps can be decreased, and thus, an inexpensive CATV tuner can be obtained.

The above-described and other features, elements, characteristics, and advantages of the present invention will become apparent from the following description of the preferred embodiments with reference to the attached drawings.

DETAILED DESCRIPTION OF PREFERRED EMBODIMENTS

Figure 1:
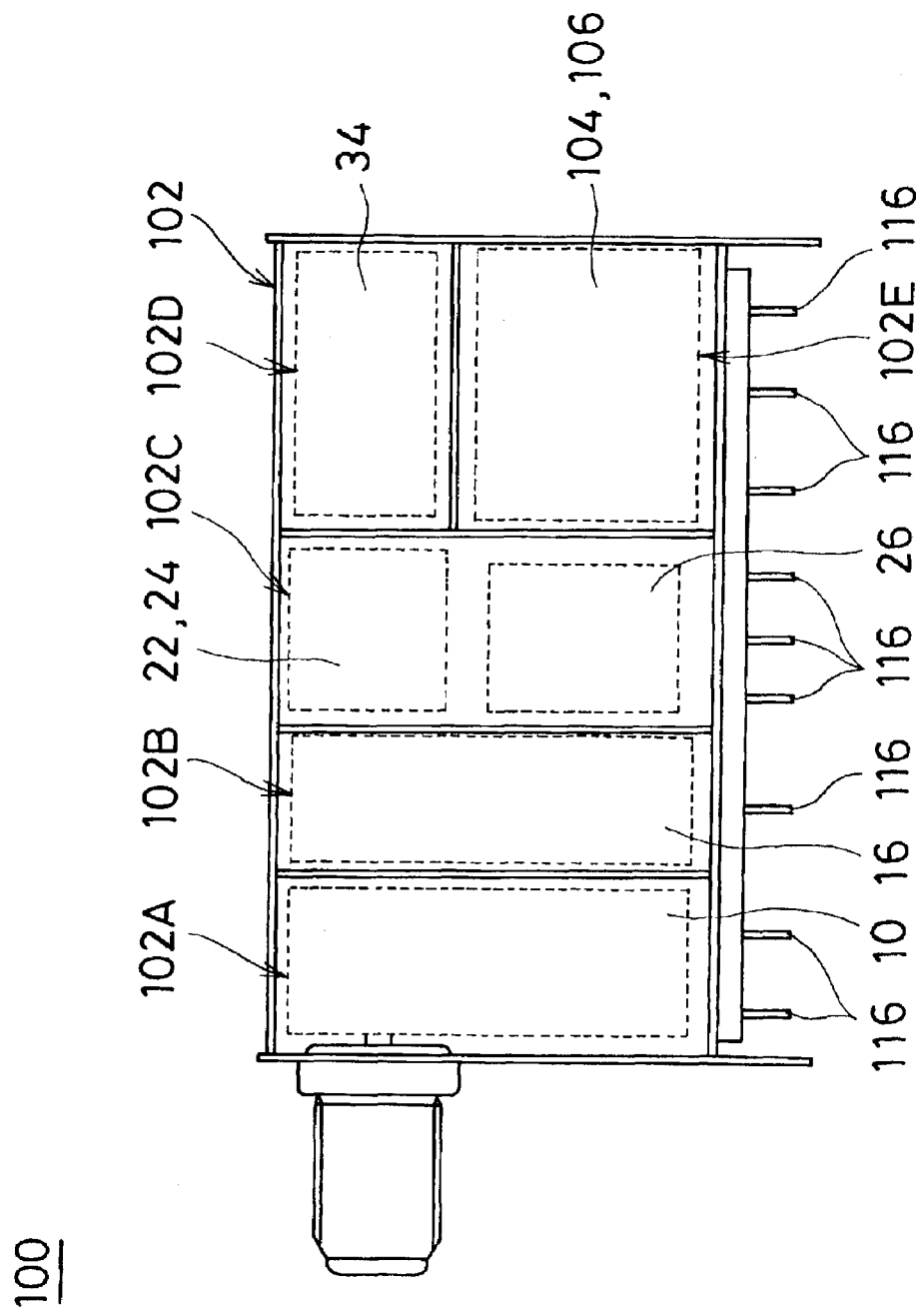
FIG. 1 is a schematic view illustrating a CATV tuner according to a preferred embodiment of the present invention.
Figure 2:
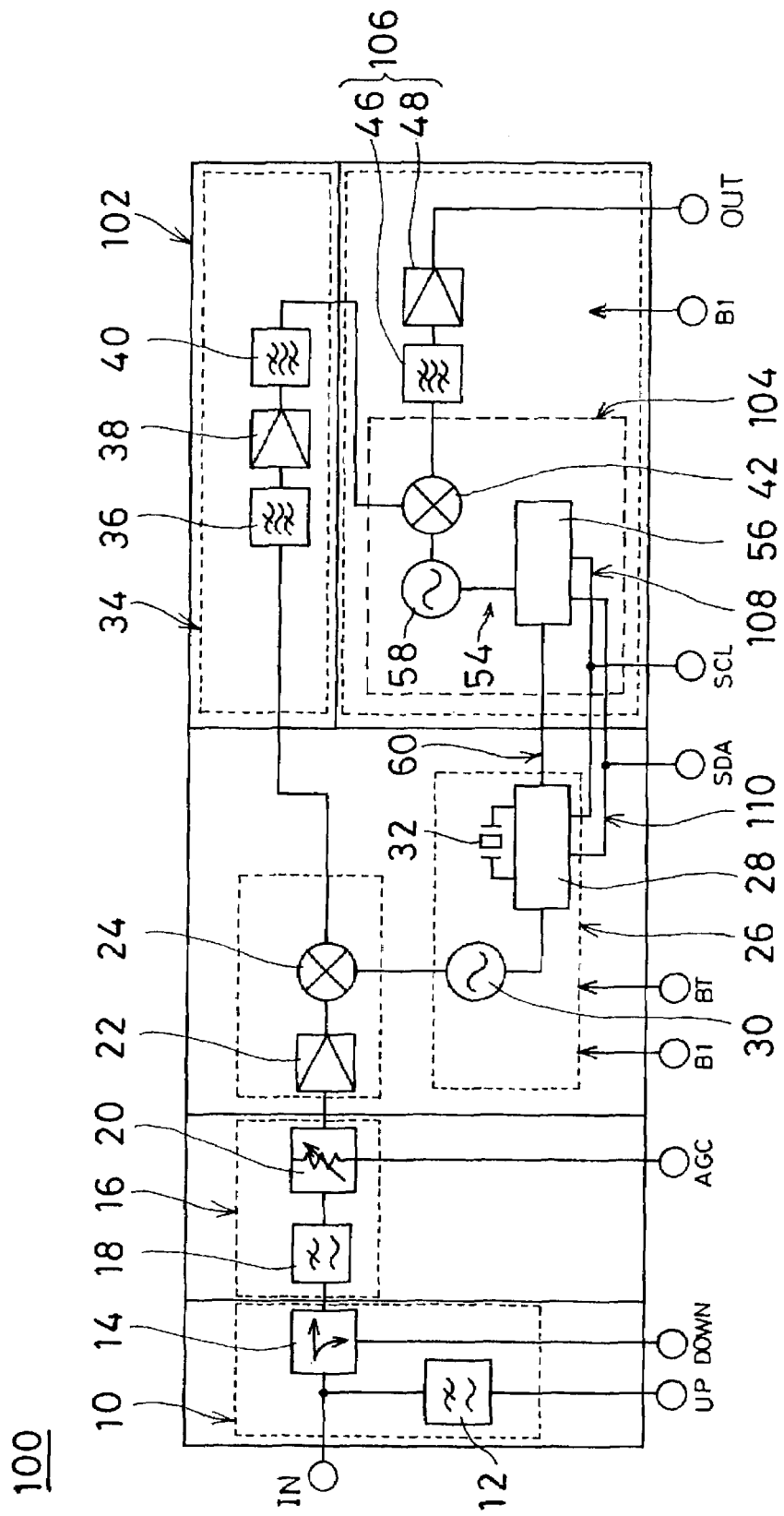
FIG. 2 is a circuit block diagram of the CATV tuner shown in FIG. 1.
Figure 4:
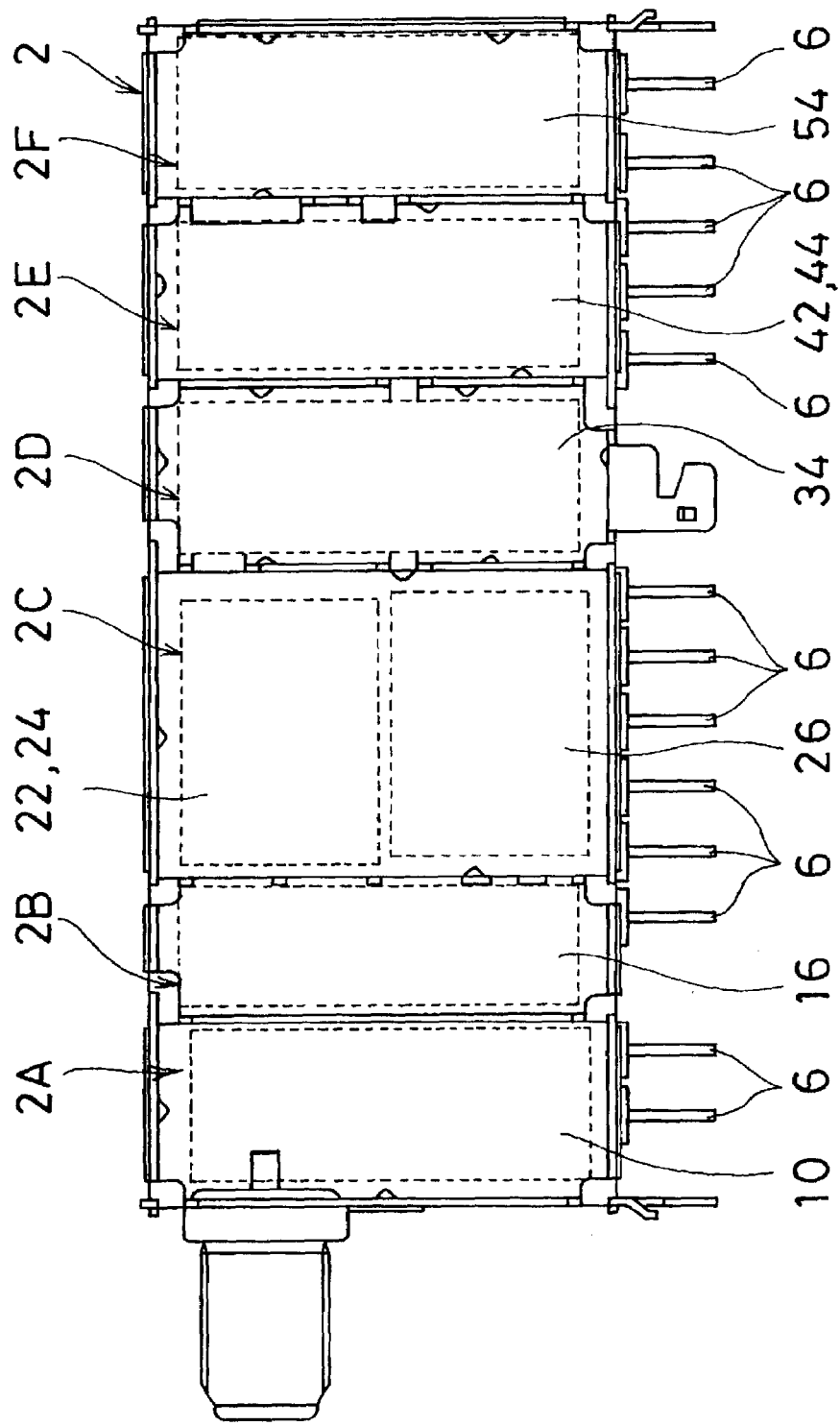
FIG. 4 is a schematic view illustrating an example of a known CATV tuner.
Figure 5:
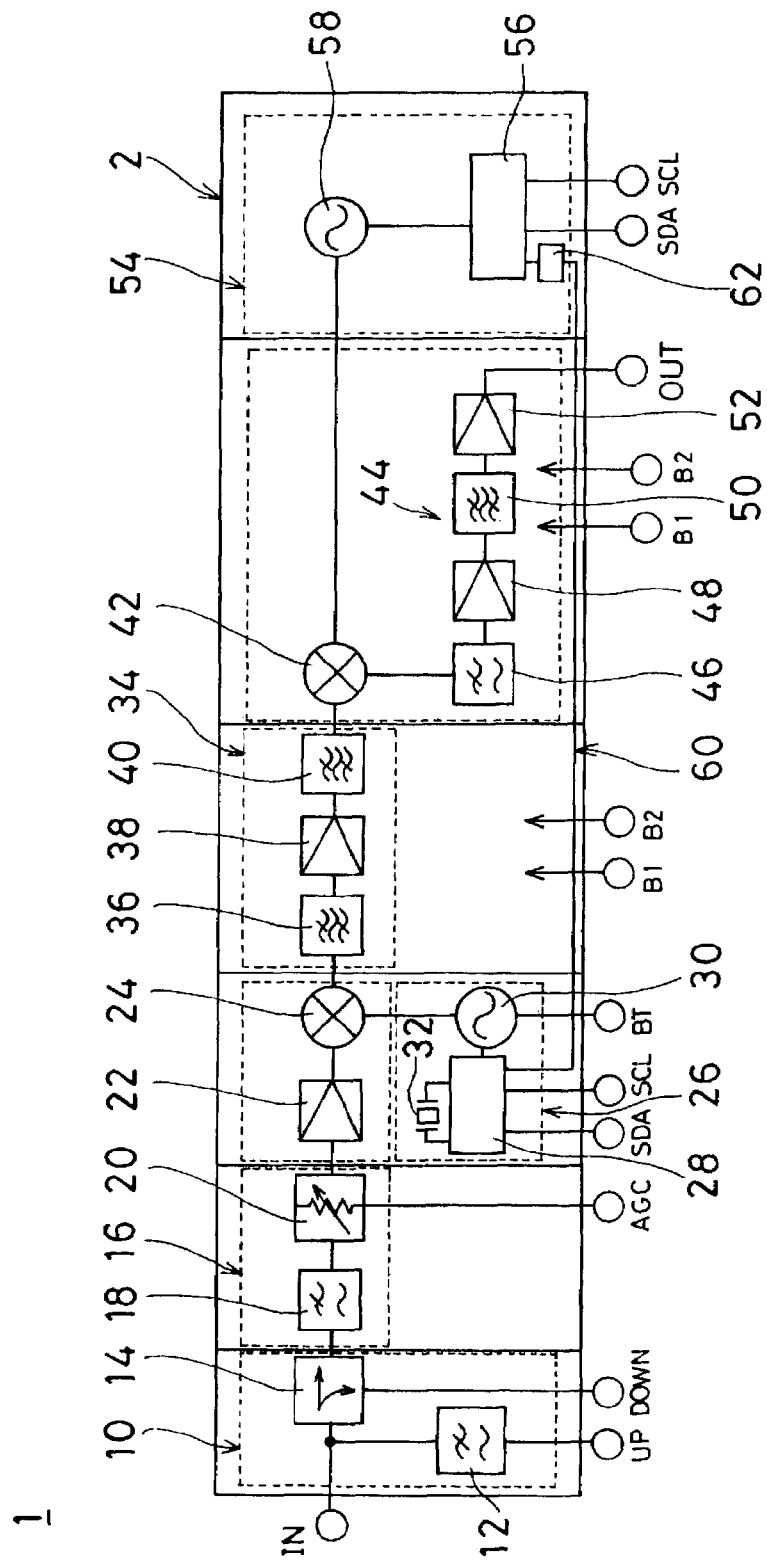
FIG. 5 is a circuit block diagram of the known CATV tuner shown in FIG. 4.
Figure 6:
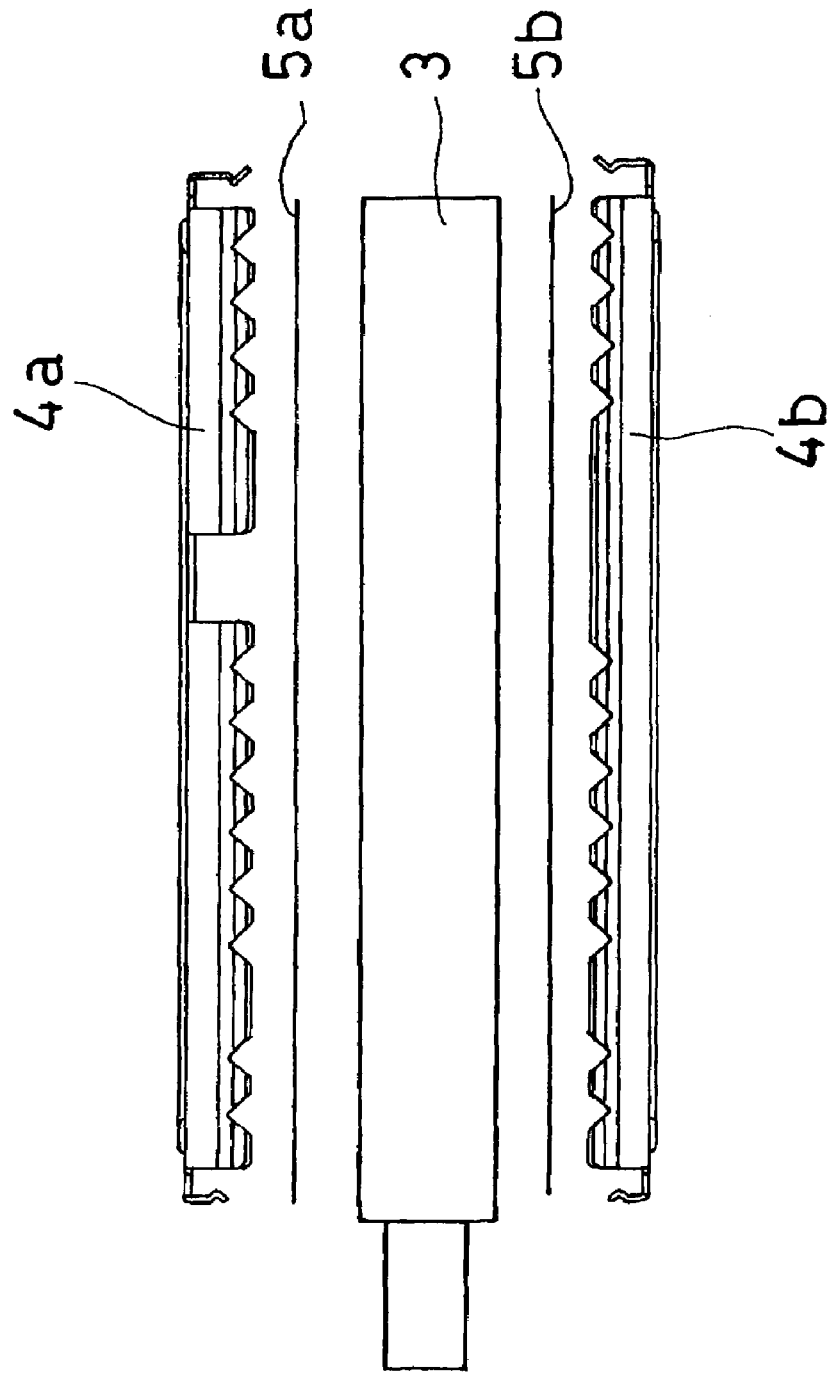
FIG. 6 is a side view illustrating a housing used in the known CATV tuner shown in FIG. 4.

FIG. 1 is a schematic view illustrating a CATV tuner 100 according to a preferred embodiment of the present invention, and FIG. 2 is a circuit block diagram of the CATV tuner 100. In FIGS. 1 and 2, the same elements as those shown in FIGS. 4 and 5 are indicated by like reference numerals.

The CATV tuner 100 includes a metallic housing 102. The housing 102 is divided into five partitioned chambers 102A, 102B, 102C, 102D, and 102E exhibiting a shielding characteristic. In the partitioned chamber 102A, the data circuit 10 including the first low-pass filter 12 and the branch circuit 14 is housed therein. In the partitioned chamber 102B, the input filter circuit 16 including the first band-pass filter 18 and the attenuator circuit 20 is housed therein.

In the partitioned chamber 102C, the first local oscillation circuit 26 including the first amplifier 22, the first mixer circuit 24, the first PLL circuit 28, and the first voltage-controlled oscillator 30 is housed therein. In the partitioned chamber 102D, the first intermediate frequency circuit 34 including the second band-pass filter 36, the second amplifier 38, and the third band-pass filter 40 is housed therein.

In the partitioned chamber 102E, an IC 104 and a second intermediate frequency circuit 106 are housed therein. In the IC 104, the second mixer circuit 42 and the second local oscillation circuit 54, which includes the second PLL circuit 56 and the second voltage-controlled oscillator 58, are provided. The second intermediate frequency circuit 106 includes the second low-pass filter 46 and the third amplifier 48.

In this CATV tuner 100, the partitioned chamber 102C in which the first local oscillation circuit 26 is housed and the partitioned chamber 102E in which the IC 104 is housed are located adjacent to each other. A reference frequency signal supplied from the quartz oscillator 32 to the first PLL circuit 28 is distributed to the second PLL circuit 56 via the distribution line 60. A clock signal is input into the first PLL circuit 28 and the second PLL circuit 56 from a common terminal SCL via a common line 108. A data signal is input into the first PLL circuit 28 and the second PLL circuit 56 from a common terminal SDA via a common line 110.

Figure 3:
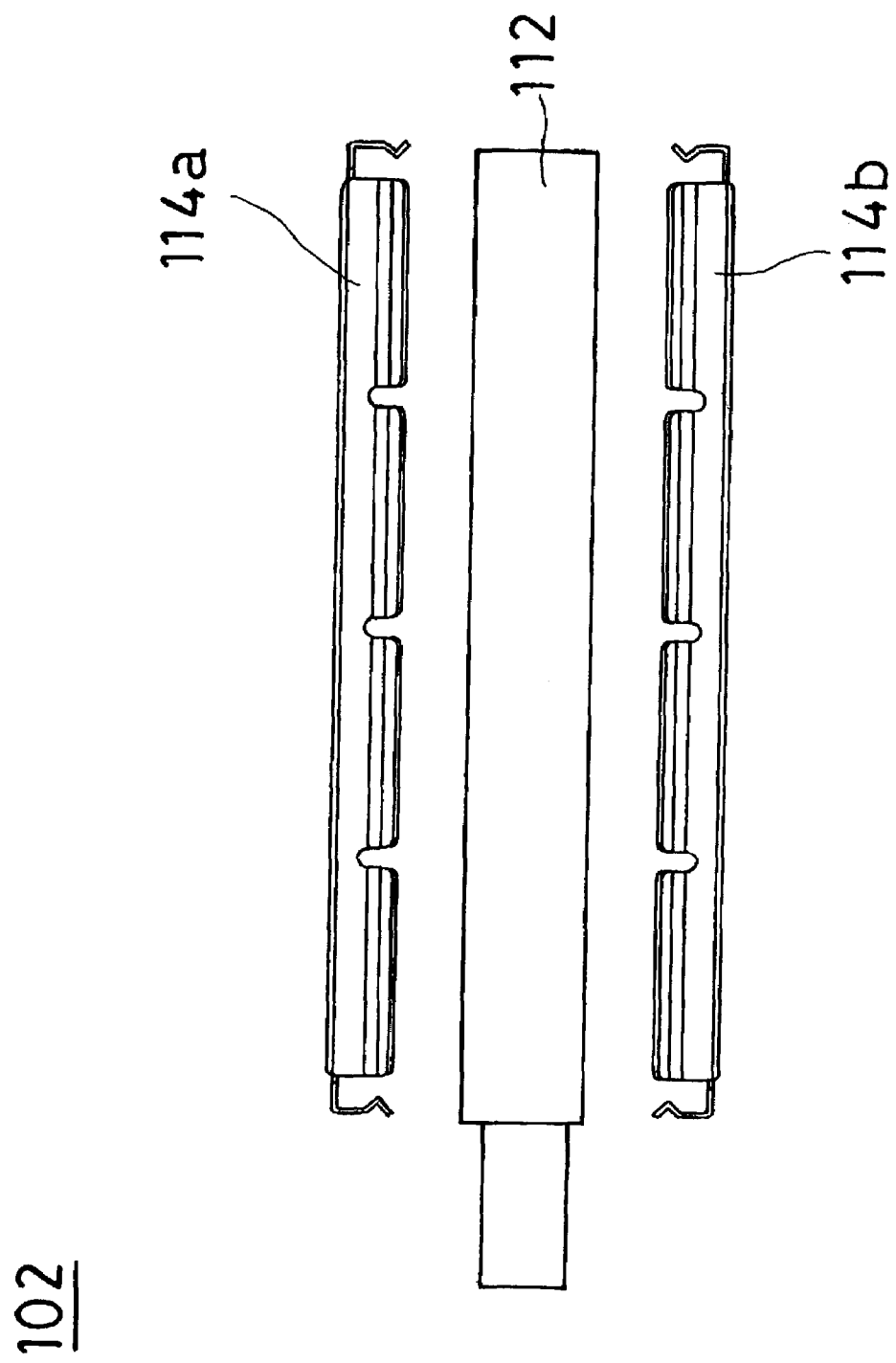
FIG. 3 is a side view illustrating a housing used in the CATV tuner shown in FIG. 1.

The housing 102 includes, as shown in FIG. 3, a metallic frame 112 divided into a plurality of partitioned chambers, and covers 114a and 114b, which cover the top and bottom surfaces, respectively, of the frame 112. The covers 114a and 114b are preferably formed by, for example, folding a metallic plate. As shown in FIG. 1, a plurality of terminals 116 are arranged so that they project from the housing 102 to the exterior. The terminals 116 are connected to the circuits within the housing 102 while being held in an insulator, such as a synthetic resin. The terminals 116, including the terminals SDA and SCL, are used for connecting the CATV tuner 100 to an external circuit. The operation of the CATV tuner 100 is similar to the counterpart shown in FIGS. 4 and 5.

In this CATV tuner 100, the second mixer 42, the second PLL circuit 56, and the second voltage-controlled oscillator 58 are integrated into the one-chip IC 104. Accordingly, the signal paths among these circuits are restricted within the IC 104, thereby preventing the occurrence of leakage of the signals to the exterior of the circuits. By integrating these circuits into the one-chip IC 104, the output level does not have to be as high as that when the circuits are individually disposed, thereby optimizing the output level of the second local oscillation circuit 54. As a result, leakage of the signals from the IC 104 is reliably prevented.

Additionally, since a double balanced mixer (DBM) is preferably used as the second mixer circuit 42, the frequency of the second local oscillation circuit 54 is not output from the mixer circuit 42 because of the configuration of the circuit. Also as a result of this feature, leakage of the signals is prevented.

As discussed above, in the CATV tuner 100, leakage of the signals from the first and second local oscillation circuits 26 and 54 is reliably prevented. Accordingly, the partitioned chamber 102C in which the first local oscillation circuit 26 and the partition chamber 102E in which the IC 104 including the second local oscillation circuit 54 is housed can be located adjacent to each other. This makes it possible to shorten the distribution line 60 for distributing the reference frequency signal from the first PLL circuit 28 to the second PLL circuit 56. Thus, noise can be prevented from being mixed into the distribution line 60, thereby eliminating the need to attach a noise-eliminating filter to the distribution line 60. As a result, the cost required for parts and a manufacturing operation can be decreased.

Since the clock signal and the data signal can be supplied to the first PLL circuit 28 and the second PLL circuit 56 via the common lines 108 and 110, the terminals SCL and SDA for supplying the clock signal and the data signal, respectively, can also be used both for the first and second PLL circuits 28 and 56. Accordingly, the space required for forming the terminals can be decreased, thereby reducing the size of the CATV tuner 100.

It is not necessary to insert metallic plates between the partitioned chambers 102A through 102E and the covers 114a and 114b since leakage of the signals from the first and second local oscillation circuits 26 and 54 is prevented. Since there is also less leakage of the signals from the terminals 116, the need to attach a feedthrough capacitor to the terminals 116 can be eliminated. The cost of parts can thus be decreased, and also, an operation for fixing metallic plates or a feedthrough capacitor is not necessary.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A cable television tuner comprising an up/down tuner, said up/down tuner comprising:
   a data circuit for transmitting and receiving a signal to and from a cable television station;
   an input filter circuit for filtering the signal received by said data circuit;
   a first mixer circuit for mixing the signal passing through said input filter circuit with a first local oscillation signal to generate a first intermediate frequency signal;
   a first local oscillation circuit including a first phase-locked loop circuit and a first voltage-controlled oscillator for supplying the first local oscillation signal to said first mixer circuit;
   a first intermediate frequency circuit for filtering and amplifying the first intermediate frequency signal;
   a second mixer circuit for mixing a signal output from said first intermediate frequency circuit with a second local oscillation signal to generate a second intermediate frequency signal;
   a second local oscillation circuit including a second phase-locked loop circuit and a second voltage-controlled oscillator for supplying the second local oscillation signal to said second mixer circuit;
   a second intermediate frequency circuit for filtering and amplifying the second intermediate frequency signal; and
   a housing including a plurality of partitioned chambers for housing therein said data circuit, said input filter circuit, said first mixer circuit, said first local oscillation circuit, said first intermediate frequency circuit, said second mixer circuit, said second local oscillation circuit, and said second intermediate frequency circuit; wherein
   said second mixer circuit, said second phase-locked loop circuit, and said second voltage-controlled oscillator are integrated into a single-chip integrated circuit;
   said first local oscillation circuit and said second local oscillation circuit are housed in respective ones of the plurality of partitioned chambers that are adjacent to each other; and
   each of said first phase-locked loop circuit and said second phase-locked loop circuit includes a common clock terminal, and each of said first phase-locked loop circuit and said second phase-locked loop circuit includes a common data terminal.

2. A cable television tuner according to claim 1, wherein said housing includes a metallic frame and at least two covers for covering top and bottom surfaces of the metallic frame, each of said at least two covers being defined by a single metallic plate.

3. A cable television tuner according to claim 1, further comprising a terminal without a feedthrough capacitor, which is arranged to connect said cable television tuner to an external circuit, the terminal being arranged so as to project from said housing to the exterior.

4. A cable television tuner according to claim 2, further comprising a terminal without a feedthrough capacitor, which is arranged to connect said cable television tuner to an external circuit, the terminal being arranged so as to project from said housing to the exterior.

5. A cable television tuner according to claim 1, wherein the metallic housing is divided into five of said partitioned chambers, each having a shielding function.

6. A cable television tuner according to claim 1, further comprising a plurality of terminals arranged to project from the housing to an exterior thereof.

7. A cable television tuner according to claim 1, wherein said second mixer circuit includes a double balanced mixer.

8. A cable television tuner according to claim 1, wherein said housing is metallic.

9. A cable television tuner according to claim 1, wherein at least one common terminal for a corresponding one of a reference frequency signal, a channel-selection data signal, and a clock signal is provided for said single-chip integrated circuit.

10. A single-chip integrated circuit to be used in a cable television tuner comprising:
   a data circuit for transmitting and receiving a signal to and from a cable television station;
   an input filter circuit for filtering the signal received by said data circuit;
   a first mixer circuit for mixing the signal passing through said input filter circuit with a first local oscillation signal and for generating a first intermediate frequency signal;
   a first local oscillation circuit including a first phase-locked loop circuit and a first voltage-controlled oscillator used for supplying the first local oscillation signal to said first mixer circuit;
   a first intermediate frequency circuit for filtering and amplifying the first intermediate frequency signal;
   a second mixer circuit for mixing a signal output from said first intermediate frequency circuit with a second local oscillation signal and for generating a second intermediate frequency signal;
   a second local oscillation circuit including a second phase-locked loop circuit and a second voltage-controlled oscillator used for supplying the second local oscillation signal to said second mixer circuit;
   a second intermediate frequency circuit for filtering and amplifying the second intermediate frequency signal;
   a housing including a plurality of partitioned chambers for housing therein said data circuit, said input filter circuit, said first mixer circuit, said first local oscillation circuit, said first intermediate frequency circuit, said second mixer circuit, said second local oscillation circuit, and said second intermediate frequency circuit, said first local oscillation circuit and said second local oscillation circuit are housed in respective ones of the plurality of partitioned chambers that are adjacent to each other; wherein said single-chip integrated circuit includes a circuit defined by said second mixer circuit, said second phase-locked loop circuit, and said second voltage-controlled oscillator; and each of said first phase-locked loop circuit and said second phase-locked loop circuit includes a common clock terminal, and each of said first phase-locked loop circuit and said second phase-locked loop circuit includes a common data terminal.

11. A single-chip integrated circuit according to claim 10, wherein at least one common terminal for a corresponding one of a reference frequency signal, a channel-selection data signal, and a clock signal is provided for said single one-chip integrated circuit so that it is used both for said single-chip integrated circuit and said first phase-locked loop circuit.

12. A single-chip integrated circuit according to claim 10, wherein the second mixer circuit is a double balanced type mixer circuit.

13. A single-chip integrated circuit according to claim 10, wherein said housing includes a metallic frame and at least two covers for covering top and bottom surfaces of the metallic frame, each of said at least two covers being defined by a single metallic plate.

14. A single-chip integrated circuit according to claim 10, further comprising a terminal without a feedthrough capacitor, which is arranged to connect said cable television tuner to an external circuit, the terminal being arranged so as to project from said housing to the exterior.

15. A single-chip integrated circuit according to claim 10, further comprising a terminal without a feedthrough capacitor, which is arranged to connect said cable television tuner to an external circuit, the terminal being arranged so as to project from said housing to the exterior.

16. A single-chip integrated circuit according to claim 10, further comprising a plurality of terminals arranged to project from the housing to an exterior thereof.

17. A single-chip integrated circuit according to claim 10, wherein said housing is metallic.

* * * * *